(12) United States Patent
Uezato

(10) Patent No.: US 10,541,219 B2
(45) Date of Patent: Jan. 21, 2020

(54) SEMICONDUCTOR MODULE, BASE PLATE OF SEMICONDUCTOR MODULE, AND METHOD OF MANUFACTURING SEMICONDUCTOR DEVICE

(71) Applicant: FUJI ELECTRIC CO., LTD., Kawasaki-shi, Kanagawa (JP)

(72) Inventor: Yoshinori Uezato, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/943,570

(22) Filed: Apr. 2, 2018

(65) Prior Publication Data
US 2018/0337153 A1 Nov. 22, 2018

(30) Foreign Application Priority Data

May 17, 2017 (JP) ................................ 2017-098567

(51) Int. Cl.
*H01L 23/00* (2006.01)
*H01L 23/367* (2006.01)
*H01L 23/40* (2006.01)
*H01L 23/492* (2006.01)

(52) U.S. Cl.
CPC .......... *H01L 24/09* (2013.01); *H01L 23/3672* (2013.01); *H01L 23/4006* (2013.01); *H01L 24/33* (2013.01); *H01L 24/83* (2013.01); *H01L 23/4012* (2013.01); *H01L 23/492* (2013.01); *H01L 2023/405* (2013.01);
(Continued)

(58) Field of Classification Search
CPC ............ H01L 23/4012; H01L 23/4062; H01L 23/492; H01L 2224/0905; H01L 2224/09055; H01L 24/09; H01L 2023/4031; H01L 2023/405; H01L 23/4006
See application file for complete search history.

(56) References Cited

U.S. PATENT DOCUMENTS 5,172,755 A * 12/1992 Samarov ............. H01L 23/4006
165/185
5,394,942 A * 3/1995 Catania ................. E21B 36/001
166/302
(Continued)

FOREIGN PATENT DOCUMENTS

| JP | 2003-086745 A | 3/2003 |
| JP | 2008-172146 A | 7/2008 |
| JP | 2013-004880 A | 1/2013 |

*Primary Examiner* — David A Zarneke
(74) *Attorney, Agent, or Firm* — Rabin & Berdo, P.C.

(57) ABSTRACT

A base plate having concave curved portions (rearward-convex parts) curved in a rearward direction to be convex and have a predetermined curvature, is fixed to a surface of a cooling fin while being in contact with the surface of the cooling fin at vertices of the rearward-convex parts. A stacked substrate is bonded on a front surface of the base plate, at an area opposing the rearward-convex part. A spacer is provided on a rear surface of the base plate, at a position closer than an edge of a solder layer to a perimeter of the base plate. The spacer is sandwiched between the base plate and the cooling fin when a screw for fixing the base plate to the cooling fin is tightened and the spacer has a function of suppressing deformation of the base plate.

16 Claims, 21 Drawing Sheets

(52) U.S. Cl.
CPC ............... *H01L 2023/4031* (2013.01); *H01L 2224/0905* (2013.01); *H01L 2224/09055* (2013.01)

(56) References Cited

U.S. PATENT DOCUMENTS

| | | | | |
|---|---|---|---|---|
| 5,981,036 | A * | 11/1999 | Schulz-Harder | H01L 23/13 257/E23.004 |
| 6,654,250 | B1 * | 11/2003 | Alcoe | H05K 1/189 257/719 |
| 7,074,644 | B2 * | 7/2006 | Kimura | H01L 21/6835 438/106 |
| 7,511,961 | B2 * | 3/2009 | Tschirbs | H01L 23/492 361/704 |
| 7,888,790 | B2 * | 2/2011 | Atkinson, Jr. | H01L 23/10 257/701 |
| 8,050,054 | B2 * | 11/2011 | Chen | H01L 23/367 174/252 |
| 9,666,504 | B2 * | 5/2017 | Abeyasekera | H01L 23/3735 |
| 9,711,430 | B2 * | 7/2017 | Nishida | H01L 23/3121 |
| 10,104,812 | B2 * | 10/2018 | Bayerer | H01L 23/36 |
| 2002/0067599 | A1 * | 6/2002 | Mann | H01L 23/3672 361/704 |
| 2007/0258194 | A1 * | 11/2007 | Okayama | H01L 25/162 361/600 |
| 2011/0100681 | A1 * | 5/2011 | Kimmich | H01L 23/3677 174/252 |

* cited by examiner

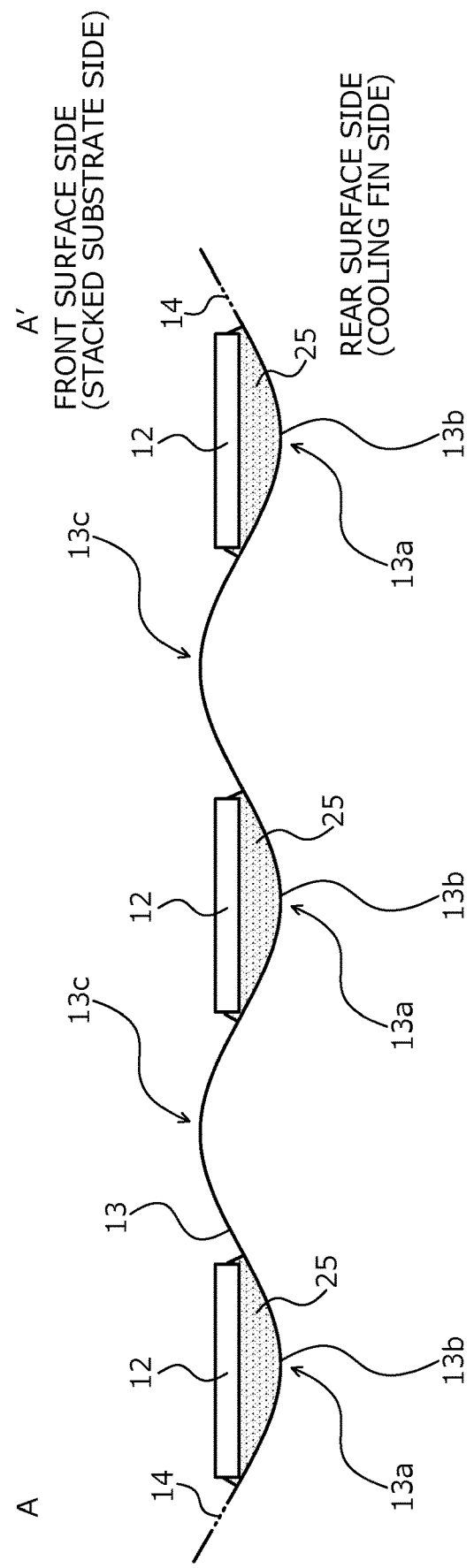

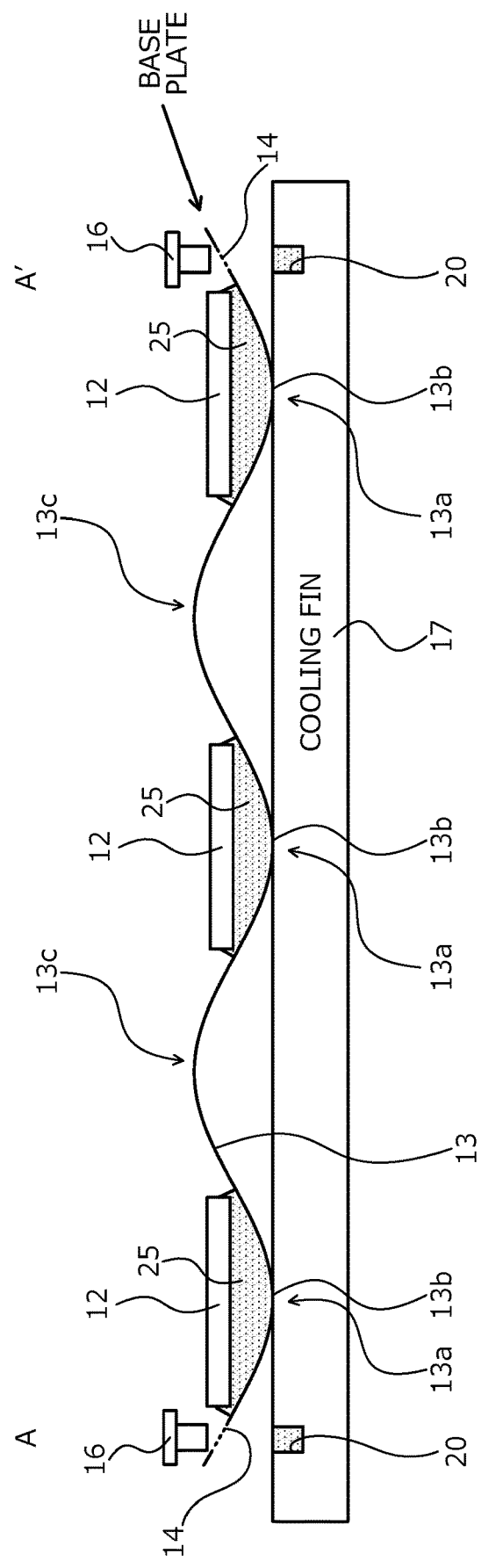

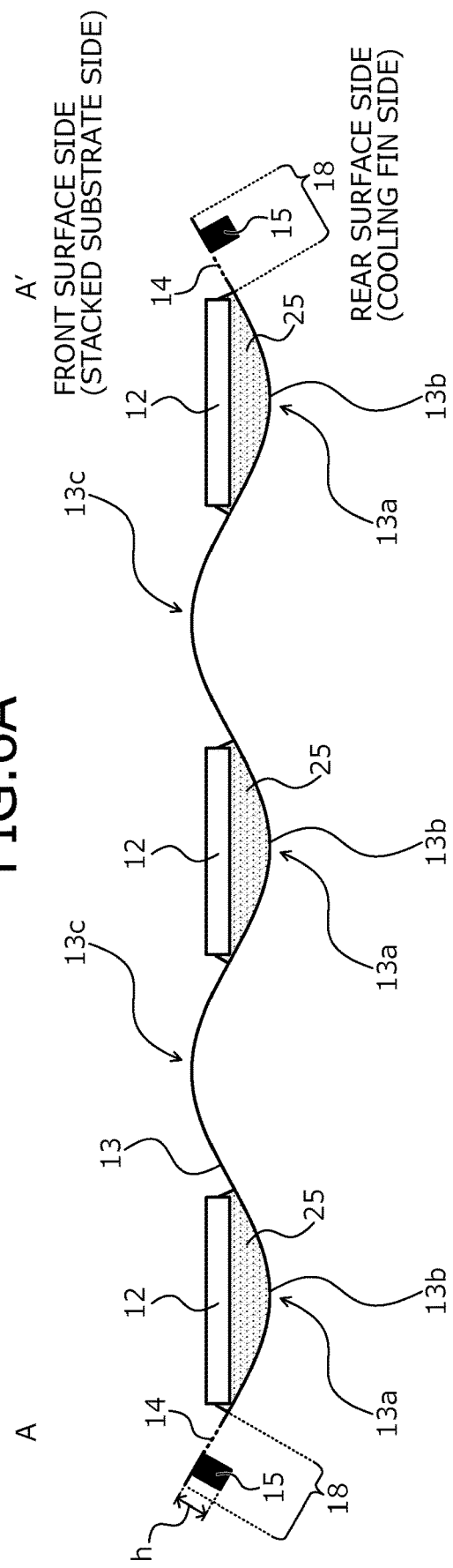

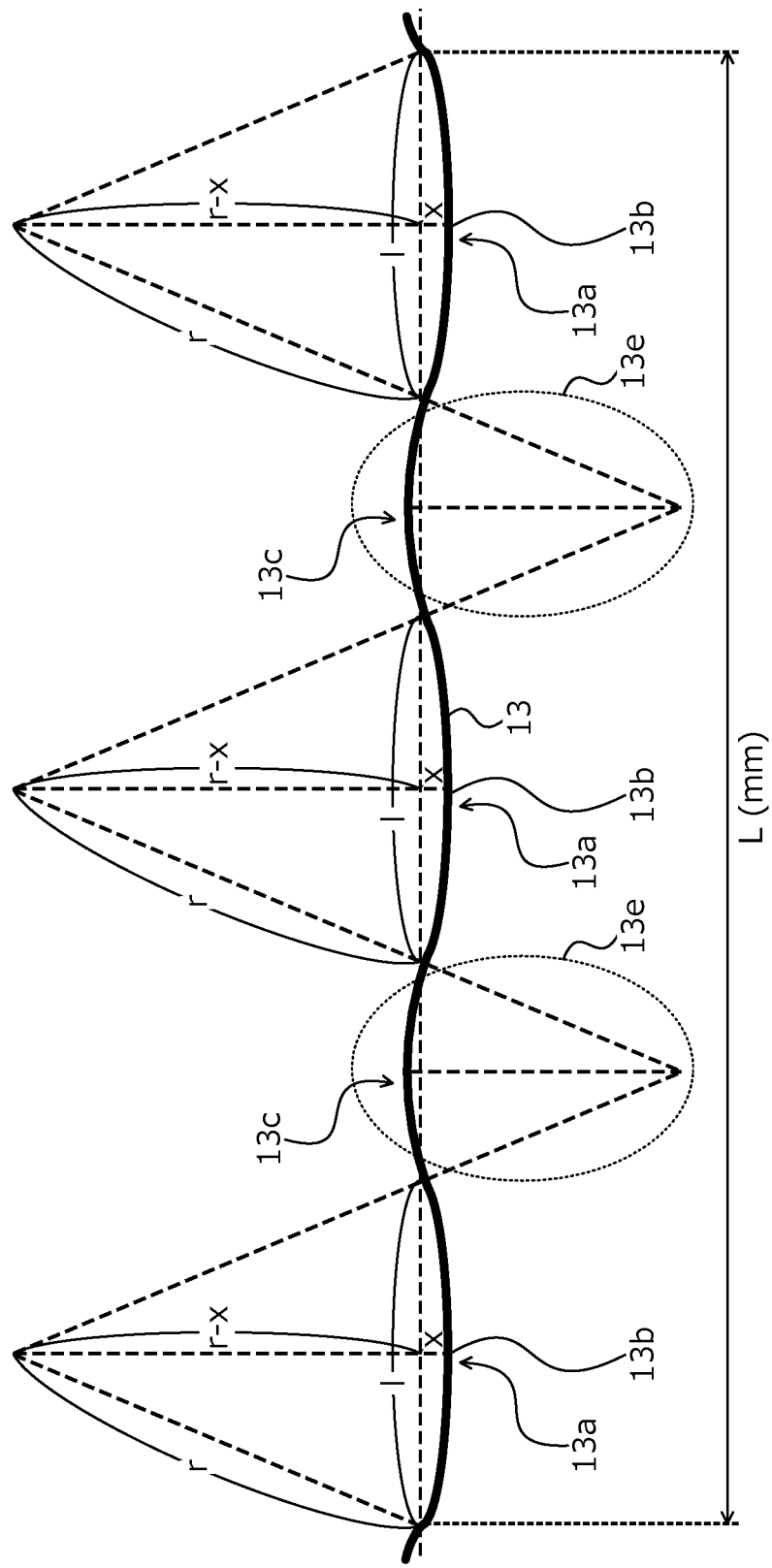

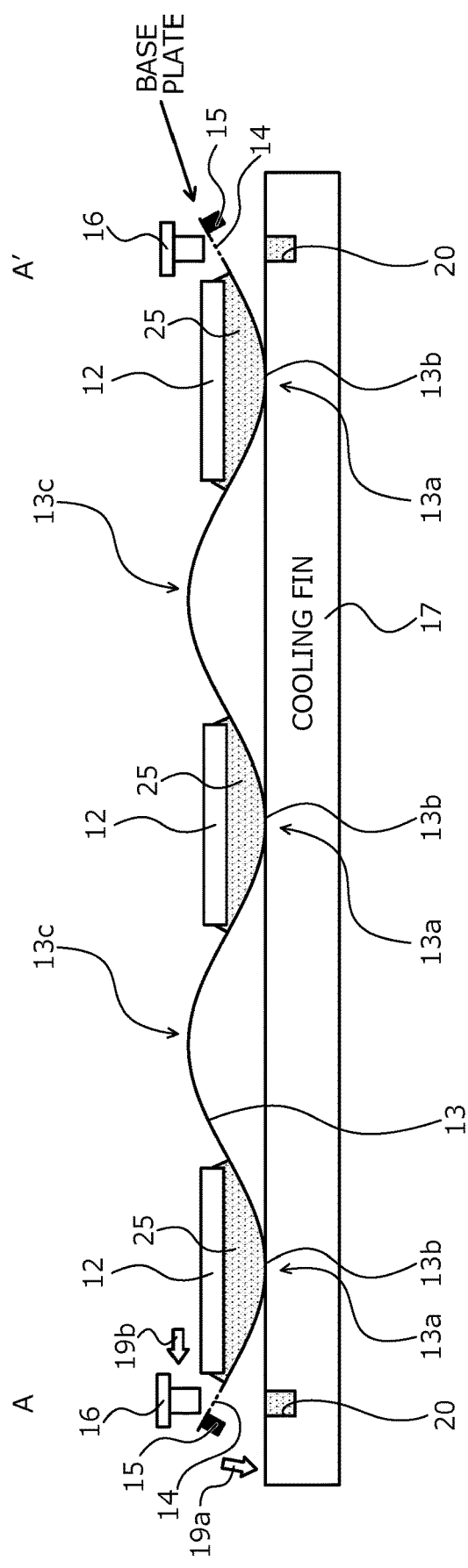

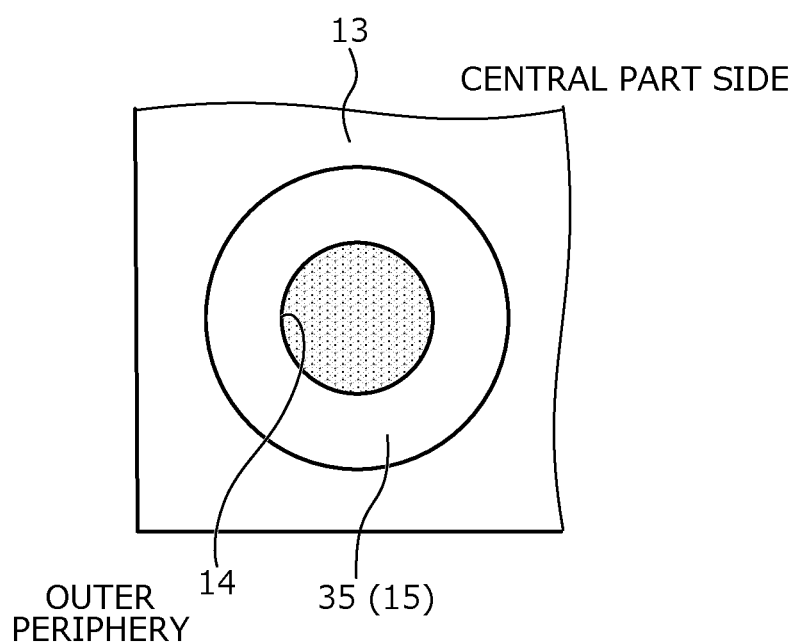

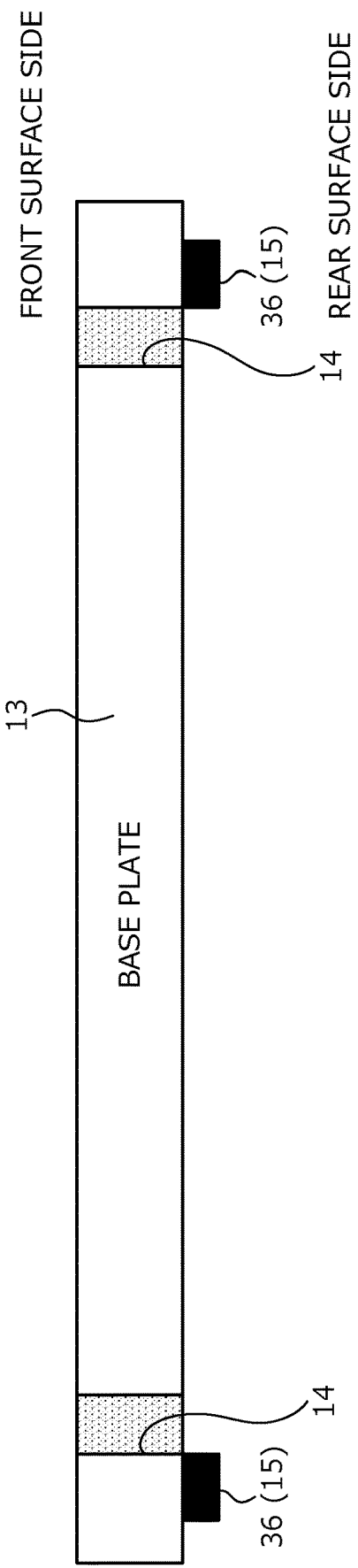

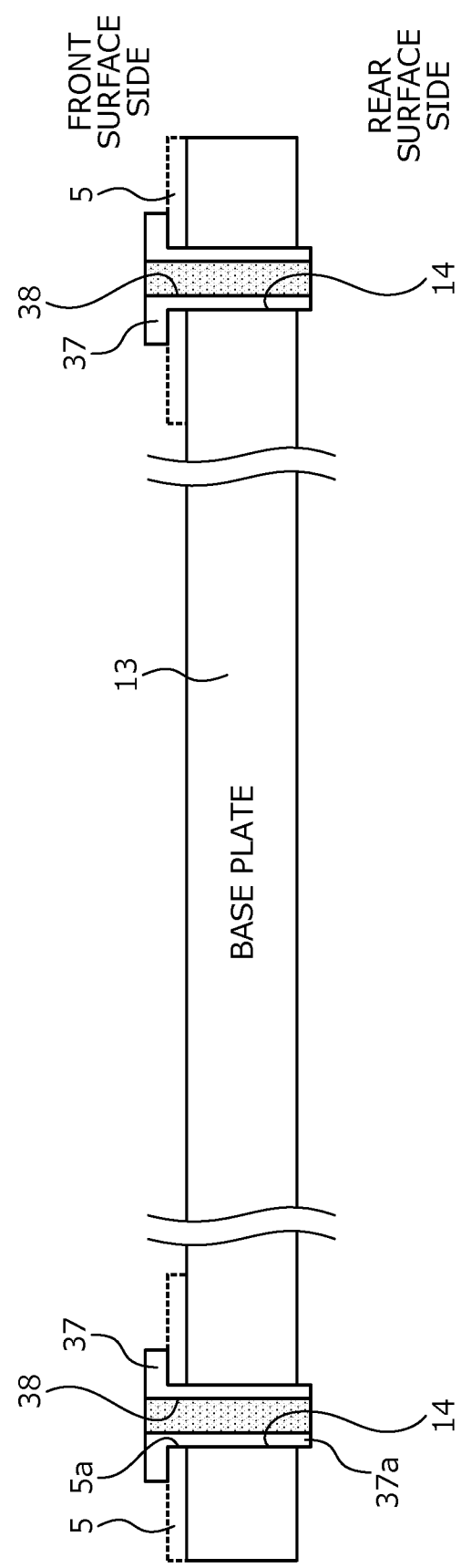

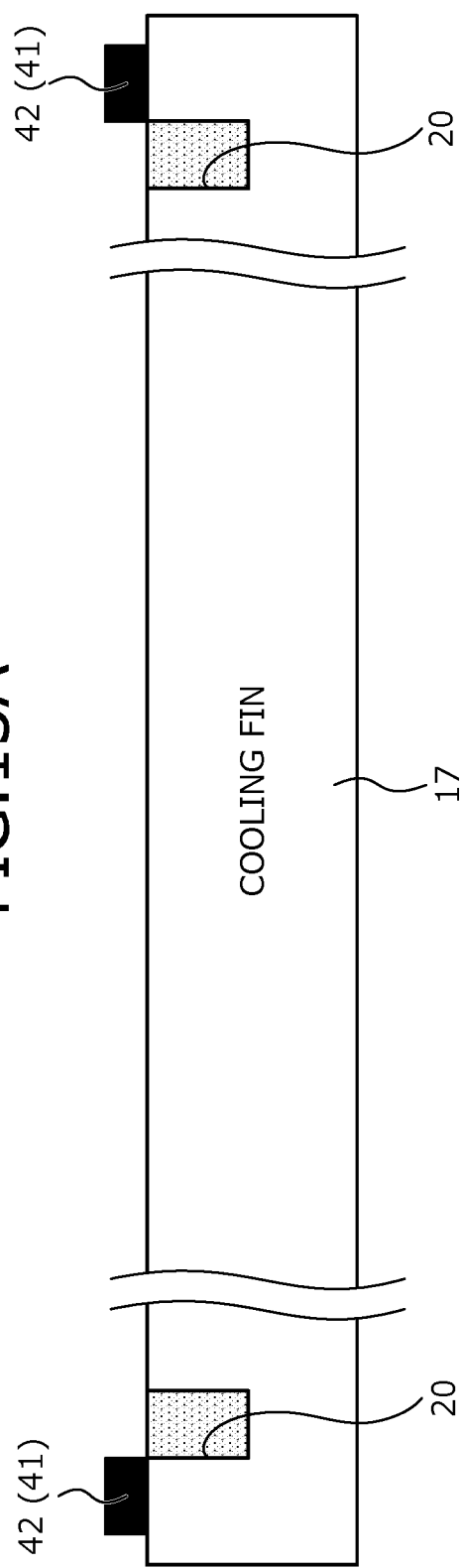

SEMICONDUCTOR MODULE, BASE PLATE OF SEMICONDUCTOR MODULE, AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-098567, filed on May 17, 2017, the entire contents of which are incorporated herein by reference.

BACKGROUND OF THE INVENTION

1. Field of the Invention

Embodiments of the present invention relate to a semiconductor module, a base plate of a semiconductor module, and a method of manufacturing a semiconductor device.

2. Description of the Related Art

A package structure called a case structure is mainstream for semiconductor modules in which a semiconductor chip implementing a power transistor, diode, etc. is sealed/enveloped by a filling material. Here, a structure of a conventional semiconductor module will be described. FIG. 14 is a cross-sectional view of a structure of a conventional semiconductor module.

A conventional semiconductor module 100 depicted in FIG. 14 has a configuration in which a semiconductor chip 101 is mounted on a stacked substrate 102 and the stacked substrate 102 is mounted on a front surface of a base plate 103. A conventional semiconductor device in which the semiconductor module 100 is mounted has a configuration in which a rear surface of the base plate 103 of the semiconductor module 100 is in contact with a surface of a cooling fin, which is not depicted. The semiconductor module 100 is fixed to the surface of the cooling fin by screwing into a screw hole of the cooling fin, a non-depicted screw that is inserted into a through hole 104 of the base plate 103.

The stacked substrate 102 is arranged on the front surface of the base plate 103. Reference numerals 112, 113 are respectively conductive plates formed respectively on a front surface and a rear surface of an insulating substrate 111 constituting the stacked substrate 102. Reference numeral 114 is a solder layer that bonds the semiconductor chip 101 and the conductive plate 112, which is on a front surface of the stacked substrate 102. Reference numeral 115 is a solder layer that bonds the base plate 103 and the conductive plate 113, which is on a rear surface of the stacked substrate 102.

For example, in one device proposed in Japanese Laid-Open Patent Publication No. 2013-004880 as such a conventional semiconductor module, an insulating substrate is mounted on a main surface of a base plate, and at the main surface, between a screw through hole and the insulating substrate, a groove is provided extending linearly along on a side of the insulating substrate.

Further, in a device proposed in Japanese Laid-Open Patent Publication No. 2008-172146 as another conventional semiconductor module, a part near a through hole of a part of a base plate is separated from a cooling fin (heat sink) by a protrusion formed near the through hole, and a part near another through hole of the base plate is in contact with the cooling fin.

As another conventional semiconductor module, Japanese Laid-Open Patent Publication No. 2003-086745 proposes a device in which a metal foil is inserted in a gap between a base plate and a cooling fin and the gap is filled with grease having high thermal conductivity, whereby heat dissipation is improved.

SUMMARY OF THE INVENTION

According to an embodiment of the present invention, a semiconductor module includes a stacked substrate on which a semiconductor chip is mounted, and a base plate having a front surface and a rear surface, the stacked substrate being bonded at a bonding area of the front surface of the base plate. The base plate has a concave curved portion of the front surface, and has a plurality of through holes that is closer to a perimeter than is the bonding area of the base plate. The plurality of through holes penetrate the base plate from the front surface to the rear surface. The base plate is fixable to a cooling fin via a screw insertable in each of the plurality of through holes, with the cooling fin, facing the rear surface of the base plate, being placed at a vertex of the concave curved portion of the base plate.

In the embodiment, the base plate has the curved part curved to be convex in the rearward direction, at the bonding site of the stacked substrate.

In the embodiment, two or more of the stacked substrates is bonded to the base plate, and the base plate has the curved part at each of the bonding sites of the stacked substrates.

In the embodiment, curvature of the curved part is $0.1 \times 10^{-3}$/mm to $0.4 \times 10^{-3}$/mm.

In the embodiment, the base plate has a rectangular planar shape, and a through hole of the plural through holes is arranged at each vertex of the base plate.

In the embodiment, the semiconductor module further includes a spacer arranged closer to the perimeter of the base plate than to the bonding site of the stacked substrate, the spacer being arranged to be sandwiched between the base plate and the cooling fin.

In the embodiment, the spacer is arranged in the base plate, at locations relatively close to the plural through holes.

In the embodiment, the spacer has an arc-shaped planar shape that surrounds a part of a through hole of the plurality of through holes.

In the embodiment, the spacer has a circular planar shape that surrounds a perimeter of a through hole of the plurality of through holes.

In the embodiment, the spacer is formed integrally with the base plate and protrudes from the rear surface of the base plate. The spacer has a predetermined height.

In the embodiment, the spacer is formed integrally with the cooling fin and protrudes from a surface of the cooling fin facing toward the base plate. The spacer has a predetermined height.

In the embodiment, the spacer is bonded to the base plate and protrudes from the rear surface of the base plate. The spacer has a predetermined height.

In the embodiment, the semiconductor module further includes a fixing component having a cylinder shape and pressure fit in the plural through holes from the front surface of the base plate, the screws being inserted in the fixing component. The spacer is a part of the fixing component, the part protruding from the rear surface of the base plate.

In the embodiment, a height h of the spacer satisfies:

$$0.1 \times \left( r - \sqrt{r^2 - \left(\frac{L}{2n}\right)^2} \right) \leq h \leq r - \sqrt{r^2 - \left(\frac{L}{2n}\right)^2}$$

where, 1/r is curvature of the curved part, L is an interval of the plurality of through holes, and n is a number of the stacked substrates in a row.

In the embodiment, a height of the spacer is 10 μm to 100 μm.

In the embodiment, the height of the spacer is 20 μm to 50 μm.

According to another embodiment of the present invention, a method of manufacturing a semiconductor device, includes preparing a stacked substrate on which a semiconductor chip is mounted, a base plate, and a cooling fin, the base plate having a bonding area of a front surface of the base plate, a through hole being closer to a perimeter of the base plate than is the bonding area, and a spacer provided in a vicinity of the through hole and protruding by a predetermined height from a rear surface of the base plate, bonding a rear surface of the stacked substrate to the bonding area of the front surface of the base plate so as to curve the base plate forming a concave curved portion at the bonding area of the front surface of the base plate, inserting a screw in the through hole of the base plate while a vertex of the concave curved portion is in contact with a surface of the cooling fin, and engaging the screw with a screw hole of the cooling fin until the spacer is in contact with the cooling fin, thereby fixing the base plate to the cooling fin.

According to another embodiment of the present invention, a method of manufacturing a semiconductor device, includes preparing a stacked substrate on which a semiconductor chip is mounted, a base plate, and a cooling fin, the base plate having a bonding area of a front surface of the base plate, and a through hole being closer to a perimeter of the base plate than is the bonding area, the cooling fin having a spacer provided closer to a perimeter of the cooling fin than is an area corresponding to the bonding area of the base plate, the spacer protruding by a predetermined height from a front surface of the cooling fin, bonding a rear surface of the stacked substrate to the bonding area of the front surface of the base plate so as to curve the base plate forming a concave curved portion at the bonding area of the front surface of the base plate, inserting a screw in the through hole of the base plate while a vertex of the concave curved portion of a rear surface of the base plate is in contact with the front surface of the cooling fin, and engaging the screw with a screw hole of the cooling fin until the spacer is in contact with the base plate, thereby fixing the base plate to the cooling fin.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5A is a section view schematically depicting a cross-sectional shape of the base plate depicted in FIG. 3;

FIG. 5C is section view schematically depicting a fixing method for a cooling fin of the semiconductor module according to the first embodiment;

FIG. 6A is a section view of a structure of the semiconductor module according to a second embodiment;

FIG. 7B is a diagram for explaining a method of calculating the height the a spacer of the base plate;

FIG. 8 is a section view schematically depicting a fixing method for a cooling fin of the semiconductor module according to the second embodiment;

FIG. 10B is a plan view depicting a layout of the spacer in FIG. 10A as viewed from the rear surface side of the base plate;

FIG. 11 is a cross-sectional view depicting an example of a method of forming the spacer of the base plate in FIG. 8;

FIG. 12 is a cross-sectional view depicting an example of a method of forming the spacer of the base plate in FIG. 8;

FIG. 13A is a cross-sectional view depicting an example of a method of manufacturing the spacer used when the semiconductor module according to a third embodiment is housed in a package;

DETAILED DESCRIPTION OF THE INVENTION

Figure 1:
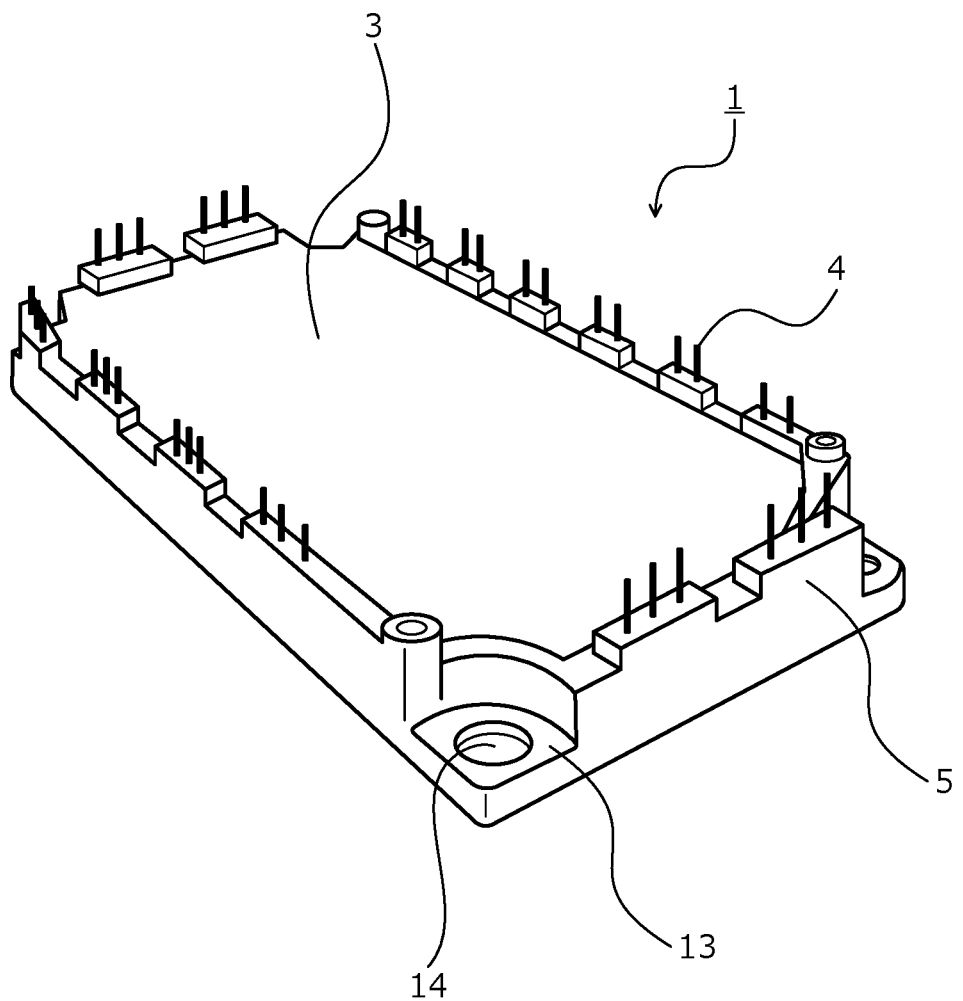
FIG. 1 is a perspective view of one example of a package housing a semiconductor module according to a first embodiment.

First, problems related to the conventional techniques will be described. In the conventional semiconductor module 100 (refer to FIG. 14), a screw, which is not depicted, is inserted in the through hole 104 of the base plate 103 and when the base plate 103 is fixed to the cooling fin by tightening the screw, concave warping, which is not depicted, occurs at the rear surface of the base plate 103 (surface facing toward the cooling fin). In other words, a part fixed to the cooling fin by the screw acts as a fulcrum, and a part of the base plate 103 more toward a central part than the fulcrum is curved overall in a direction away from the cooling fin. Therefore, a gap between the cooling fin and a part of the base plate 103 facing the stacked substrate 102 is created. The gap created between the base plate 103 and the cooling fin increases in size with proximity to a center of the base plate 103. As a result, a problem arises in that thermal resistance from the semiconductor chip 101 to the cooling fin increases and heat dissipation decreases.

Figure 14:
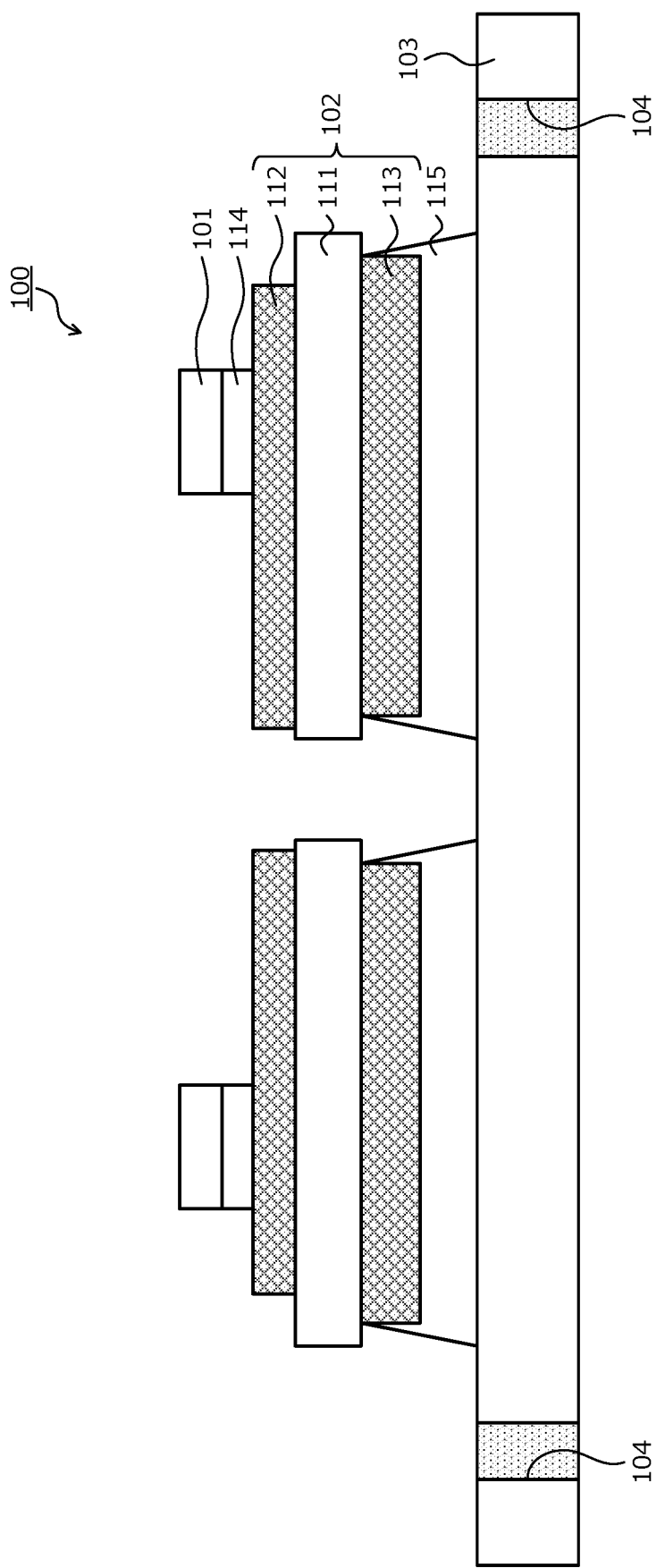
FIG. 14 is a cross-sectional view of a structure of a conventional semiconductor module.

Further, when a convex shape is formed toward the cooling fin and a screw is tightened as in Japanese Laid-Open Patent Publication No. 2008-172146, or when a metal foil is inserted in the gap between the base plate and the cooling fin and a screw is tightened as in Japanese Laid-Open Patent Publication No. 2003-086745, a problem arises in that cracking occurs in a ceramic insulating substrate corresponding to reference numeral 111 in FIG. 14.

Embodiments of a semiconductor module, base plate of a semiconductor module, and a method of manufacturing a semiconductor device according to the present invention will be described in detail with reference to the accompanying drawings. In the description of the embodiments below and the accompanying drawings, main portions that are identical will be given the same reference numerals and will not be repeatedly described.

Figure 2:
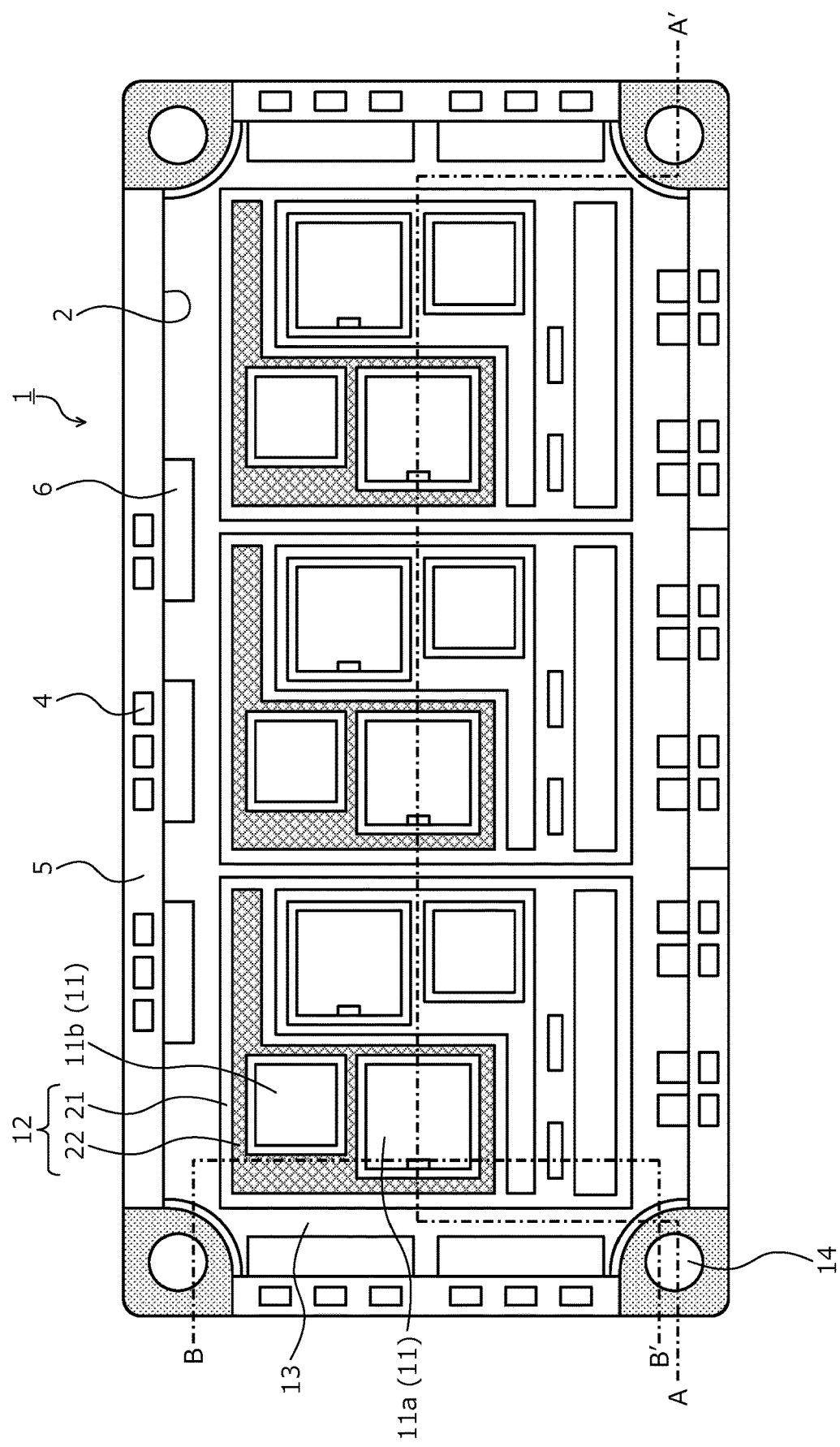
FIG. 2 is a plan view of one example of the package housing the semiconductor module according to the first embodiment.
Figure 3:
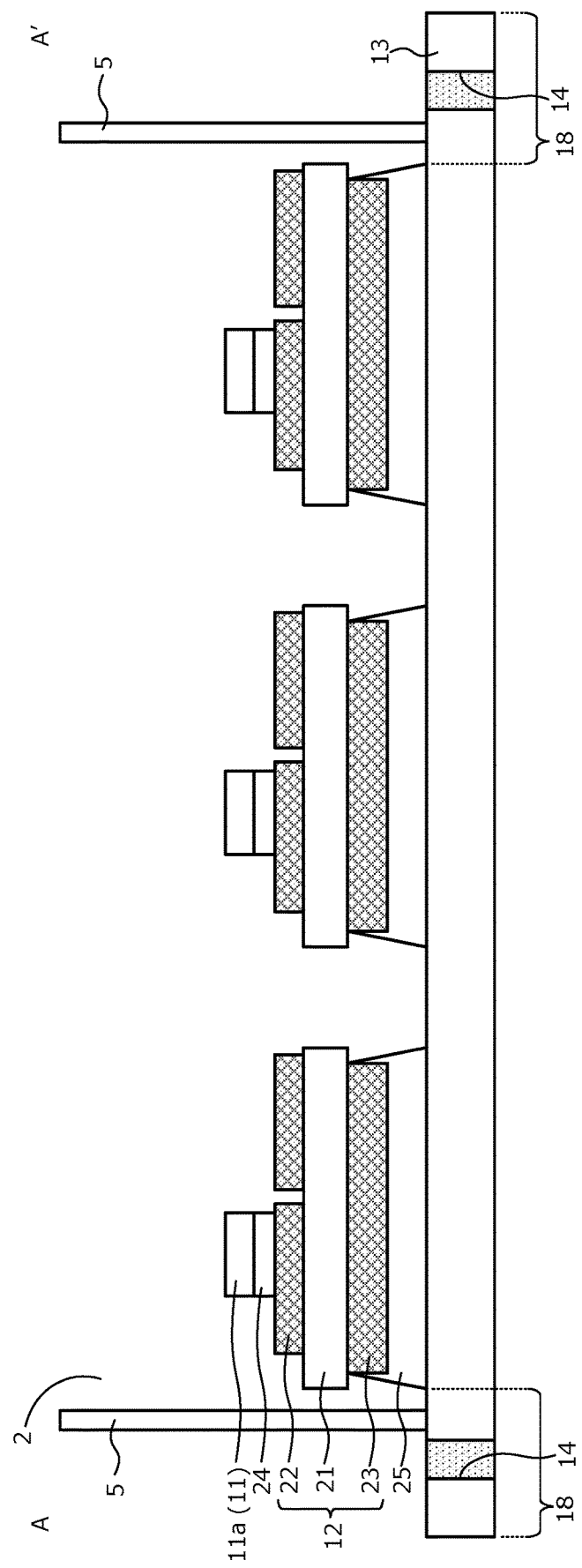
FIG. 3 is a section view along cutting line A-A' shown in FIG. 2.
Figure 4:
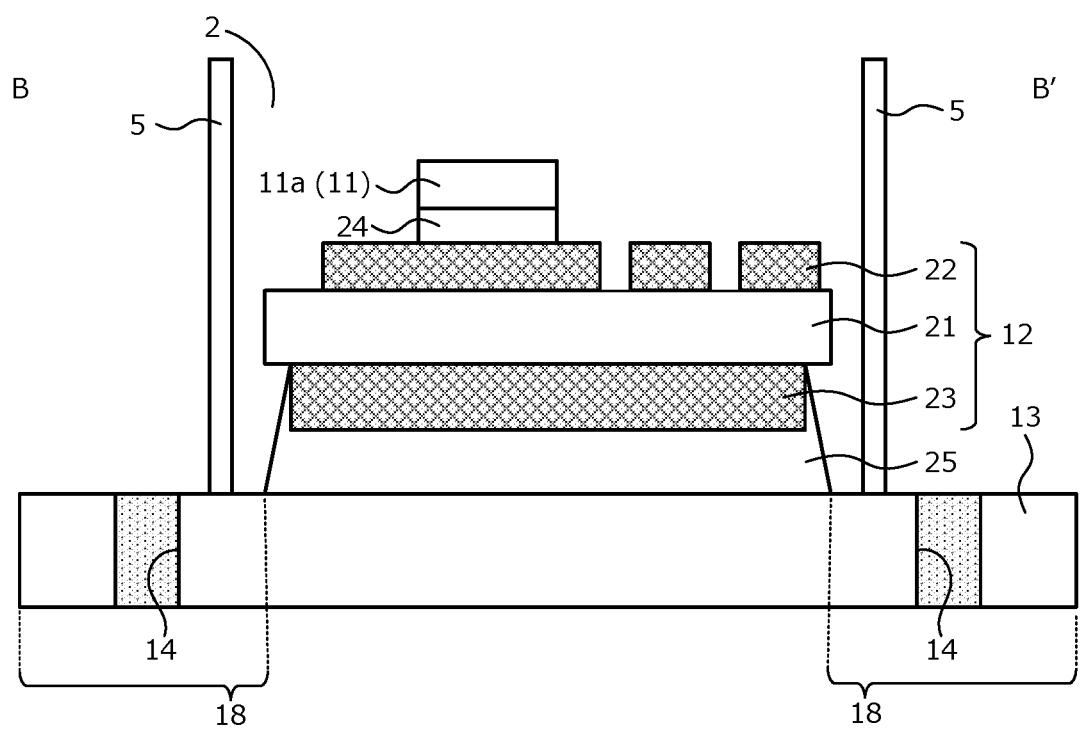
FIG. 4 is a section view along cutting line B-B' shown in FIG. 2.

FIGS. 1 and 2 are, respectively, a perspective view and a plan view of one example of a package housing the semiconductor module according to a first embodiment. FIGS. 1 and 2 respectively depict an exterior and an internal structure of the semiconductor module according to the first embodiment. FIG. 3 is a section view along cutting line A-A' shown in FIG. 2. FIG. 4 is a section view along cutting line B-B' shown in FIG. 2. In FIGS. 3 and 4, although both surfaces of a base plate 13 are depicted to be level surfaces, as depicted in FIGS. 5A and 5B, both surfaces of the base plate 13 are curved.

Figure 5B:
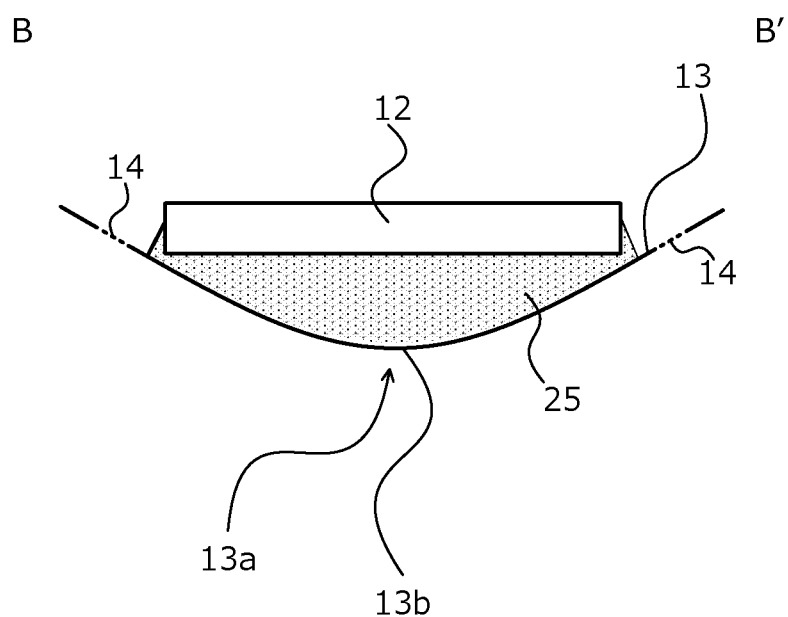
FIG. 5B is a section view schematically depicting a cross-sectional shape of the base plate depicted in FIG. 4.

FIGS. 5A and 5B are, respectively, section views schematically depicting a cross-sectional shape of the base plate depicted in FIGS. 3 and 4. FIG. 5C is section view schematically depicting a fixing method for a cooling fin of the semiconductor module according to the first embodiment. In FIGS. 5A to 5C, components of a package are not depicted and the semiconductor module alone is depicted. Further, in FIGS. 5A to 5C and similarly in FIGS. 6A, 6B, 7A, 7B, 8, and 13B, a thickness of the base plate 13 is not depicted and a cross-sectional shape of the base plate 13 is depicted as a single curved line. In FIGS. 5A to 5C and similarly in FIGS. 6A, 6B, 8, and 13B, through holes 14 of the base plate 13 are indicated by a dotted line.

First, a structure of the package housing the semiconductor module according to the first embodiment will be described. As depicted in FIGS. 1 and 2, the package housing the semiconductor module according to the first embodiment is constituted by a container body 1 that is insulating, and a cover 3 containing resin and having a flat plate-like shape, the cover 3 closing a housing part 2 that has a concave shape and that is disposed at the container body 1. The container body 1 has a configuration in which a resin case 5 that has integrally molded external connection terminals 4 is adhered to a peripheral edge of the base plate 13. Screws for fastening the cooling fin, which is not depicted, are inserted in the through holes 14.

A region of the base plate 13 surrounding one through hole 14 may be exposed, or may be covered by the resin case 5. In a case where the region surrounding the through hole 14 is covered by the resin case 5, a fixing ring depicted in FIG. 12 may be press-fit into the through hole 14. One end of each of the external connection terminals 4 protrudes outside the package (upward in FIG. 1) from a periphery of the cover 3 of the package. For example, a control circuit, etc. outside the package is connected to the external connection terminals 4. The housing part 2 of the container body 1 has a concave shape in which the base plate 13 forms a bottom and the resin case 5 forms a side wall.

As depicted in FIG. 2, at least one stacked substrate 12 to which a semiconductor chip 11 is mounted, is mounted to a front surface (the bottom of the housing part 2) of the base plate 13. The semiconductor chip 11 is soldered to a conductive plate 22 formed on a front surface of an insulating substrate 21 constituting the stacked substrate 12. FIG. 2 depicts a state in which three stacked substrates 12 are mounted on the base plate 13 and as the semiconductor chip 11, a semiconductor chip 11a implementing an insulating gate bipolar transistor (IGBT) and a semiconductor chip 11b implementing a diode are mounted to each of the stacked substrates 12.

An electrode layer, the conductive plate 22, etc. on a front surface of the semiconductor chip 11 are electrically connected, by a non-depicted bonding wire, to the other end of each of the external connection terminals 4 on a terminal block 6. The semiconductor chip 11, the stacked substrate 12, the bonding wire, etc. are sealed/enveloped by a non-depicted filling material filling the housing part 2. In FIG. 3, a conductive plate 23 on a rear surface of the insulating substrate 21 is soldered to a front surface of the base plate 13. The base plate 13 contains, for example, copper (Cu), aluminum (Al), or an alloy containing mainly copper (Cu) and/or aluminum (Al), which have high thermal conduction. A surface of the base plate 13, for example, may be covered by nickel (Ni) plating. Elastic modulus (Young's modulus) of the base plate 13 may be, for example, 50 GPa to 150 GPa.

In the base plate 13, the through holes 14 are provided at predetermined locations toward a perimeter of the base plate 13. The through holes 14 penetrate a rear surface from the front surface of the base plate 13. The through holes 14 of the base plate 13 are mounting holes for attaching (fixing) the base plate 13 to a cooling fin 17 depicted in FIG. 5C described hereinafter. An internal thread that engages with an external thread of a screw 16 depicted in FIG. 5C may be provided in an inner wall of the through holes 14 of the base plate 13. Further, the through holes 14 of the base plate 13 are arranged, for example, at each vertex of the base plate 13, which has a substantially rectangular shape.

All of the stacked substrates 12 are arranged closer than centers of the through holes 14 of the base plate 13, to a center of the base plate 13. A length of one side of the stacked substrate 12 may be, for example, about 20 mm to 60 mm, i.e., a maximum size of the stacked substrate 12 is 60 mm×60 mm. When two or more of the stacked substrates 12 are arranged on the base plate 13, the stacked substrates 12 may be arranged in a row. FIG. 2 depicts a state in which three stacked substrates 12 are arranged in one row on the base plate 13.

Plural rows of the stacked substrates 12 may be arranged on the base plate 13. An interval between adjacent stacked substrates 12 may be, for example, 1 mm to 5 mm. A length of one side of the base plate 13 may be, for example, about 30 mm to 250 mm. By setting dimensions of the base plate 13 and the stacked substrate 12 and arrangement of the stacked substrates 12 in this way, one or more of the stacked substrates 12 may be arranged on the base plate 13. In other words the maximum size of the base plate 13 is 250 mm×250 mm.

A structure of the semiconductor module according to the first embodiment will be described. The semiconductor module according to the first embodiment is constituted by the semiconductor chip 11, the stacked substrate 12, and the base plate 13. As depicted in FIGS. 3 and 4, one or more of the stacked substrates 12 to which the semiconductor chip 11 is mounted, is mounted on the front surface of the base plate 13 (the bottom of the housing part 2). The stacked substrate 12 is obtained by forming the conductive plates 22, 23 on the front and rear surfaces of the insulating substrate 21, respectively.

As described, the resin case 5 is adhered to the peripheral edge of the base plate 13. In particular, the base plate 13 has a part 18 that is closer than an edge of a solder layer 25 to the perimeter of the base plate (the solder layer 25 bonding the stacked substrate 12 and when two or more of the stacked substrates 12 are arranged on the base plate 13, said solder layer 25 edge is that which is closest to an edge of the base plate 13, among edges of the solder layers 25), and the resin case 5 is adhered in the part 18, more centrally than the through holes 14 (to be closer than the through holes 14 to the center of the base plate 13).

The insulating substrate 21 is a ceramic substrate containing a ceramic such as, for example, aluminum oxide ($Al_2O_3$), aluminum nitride (AlN), silicon nitride ($Si_3N_4$), etc. The conductive plate 22 on the front surface of the insulating substrate 21 is a metal foil that has a predetermined wiring pattern and contains, for example, copper, aluminum, etc. The conductive plate 23 on the rear surface of the insulating substrate 21 is a metal foil that has good heat dissipation and contains, for example, copper, aluminum, etc.

An electrode layer on a rear surface of the semiconductor chip 11 is bonded to the conductive plate 22 on the front surface of the insulating substrate 21, via a solder layer 24. The conductive plate 23 on the rear surface of the insulating substrate 21 is bonded to the front surface of the base plate 13, via the solder layer 25. The solder layers 24, 25, for example, may be formed by a lead-free solder alloy containing tin (Sn) as a main component.

As schematically depicted in FIGS. 5A and 5B, both of the surfaces of the base plate 13 depicted in FIGS. 3 and 4 are curved. The front surface of the base plate 13 is a main surface facing frontward toward the stacked substrate 12 and a rear surface of the base plate 13 is a main surface facing rearward toward the cooling fin 17. Reference character 13a represents a rearward-convex part of the base plate 13, curved to be convex in a rearward direction (concave curved portion). Reference character 13b is a vertex of the rearward-convex part 13a. Reference character 13c in FIG. 5A represents a convex part of the base plate 13, curved to be convex in a frontward direction.

In a case where the stacked substrate 12 is arranged singularly without arrangement of the stacked substrate 12 in plural along one direction on the base plate 13, the base plate 13 is a metal plate having a cross-sectional shape that includes the rearward-convex part 13a curved to form an arc shape protruding rearward in a convex shape, as depicted in FIG. 5B. On the front surface of the base plate 13, the stacked substrate 12 is arranged at a position opposing the vertex 13b of the rearward-convex part 13a. In other words, the base plate 13 has the rearward-convex part 13a at a position opposing a bonding site (bonding area) of the stacked substrate 12.

In a case where two or more of the stacked substrates 12 are arranged in a row on the base plate 13, the base plate 13 is a metal plate having a wavy cross-sectional shape including alternating and repeating convex shapes that protrude frontward (toward upper side in drawing) and rearward (toward lower side in drawing), as depicted in FIG. 5A. On the front surface of the base plate 13, the stacked substrates 12 are arranged at positions opposing the vertices 13b of the rearward-convex parts 13a. In other words, when two or more of the stacked substrates 12 are bonded to the base plate 13, the rearward-convex part 13a is provided for all of the stacked substrates 12 on the base plate 13, the rearward-convex part 13a being provided at each of the positions opposing the bonding sites of the stacked substrates 12. For example, in the case where three stacked substrates 12 are arranged on the front surface of the base plate 13, the base plate 13 has three rearward-convex parts 13a, and between adjacent rearward-convex parts 13a, has a part (frontward-convex part) 13c curved to have a convex shape of a predetermined curvature in a frontward direction. In FIGS. 5A and 5B, a curvature of the rearward-convex part 13a of the base plate 13 may be, for example, about $0.1 \times 10^{-3}$/mm to $0.4 \times 10^{-3}$/mm.

As depicted in FIGS. 5A and 5B, the rearward-convex part 13a of the base plate 13, for example, has a substantially spherical crown shape. A diameter l of the rearward-convex part 13a, that is, a bottom of the spherical crown, which is circular, for example, is about a same as a length of a diagonal of the insulating substrate 21, which has a substantially rectangular planar shape. Further, the rearward-convex part 13a of the base plate 13 is not limited to a substantially spherical crown shape having a circular bottom and may be a part of a substantially ellipsoidal shape having a bottom that is substantially elliptical. The rearward-convex part 13a, that is, a bottom of an ellipsoid, which is elliptical, for example, is of a size encompassing four corners of the insulating substrate 21, which has a substantially rectangular planar shape. The stacked substrate 12 including the semiconductor chip 11 and bonded to the rearward-convex part 13a of the base plate 13, via the solder layer 25, for example, is maintained in a substantially flat state, or is warped according to an expansion ratio of each part.

The base plate 13 is fixed to the surface of the cooling fin 17 by the screws 16 inserted in the through holes 14 while the vertex 13b of the rearward-convex part 13a is in contact with the surface of the cooling fin 17 depicted in FIG. 5C. As a result, heat dissipation from the semiconductor chip 11 to the cooling fin 17 occurs smoothly, enabling cracking of the insulating substrate to be prevented.

An assembly process for fixing the semiconductor module according to the first embodiment to the surface of the cooling fin 17 will be described with reference to FIGS. 3, 4, and 5C. In FIG. 5C and similarly in FIGS. 8 and 13B, the conductive plate 22, the semiconductor chip 11, and the solder layer 24 on the front surface of the insulating substrate 21 are not depicted.

First, as a first process and as depicted in FIGS. 3 and 4, the rear surface of the semiconductor chip 11 is soldered to the conductive plate 22 of a front surface of the stacked substrate 12. Next, as a second process, the conductive plate 23 of a rear surface of the stacked substrate 12 is soldered to the front surface of the base plate 13 using, for example, a lead (Pb)-free solder alloy. At this time, as depicted in FIG. 5C, a part of the base plate 13 where the stacked substrate 12 is soldered protrudes rearward in a convex shape, forming the rearward-convex part 13a in the base plate 13.

Next, as a third process, the base plate 13 is placed on the surface of the cooling fin 17 with the rear surface of the base plate 13 facing toward the cooling fin 17. The screws 16 are inserted in the through holes 14 of the base plate 13, and the external threads of the screws 16 are engaged with the internal threads of inner walls of screw holes 20 (female threads) of the cooling fin 17, whereby the base plate 13 is fixed to the surface of the cooling fin 17. By these processes, the vertex 13b of the rearward-convex part 13a of the base plate 13 becomes in contact with the surface of the cooling fin 17, completing the assembly process.

As described, according to the first embodiment, the rearward-convex part is formed at a part where the stacked substrate of the base plate is arranged, whereby the part where the stacked substrate of the base plate is arranged may be made to contact the cooling fin, at the vertex of the rearward-convex part. As a result, heat dissipation may be maintained and cracking of the insulating substrate may be prevented.

Figure 6B:
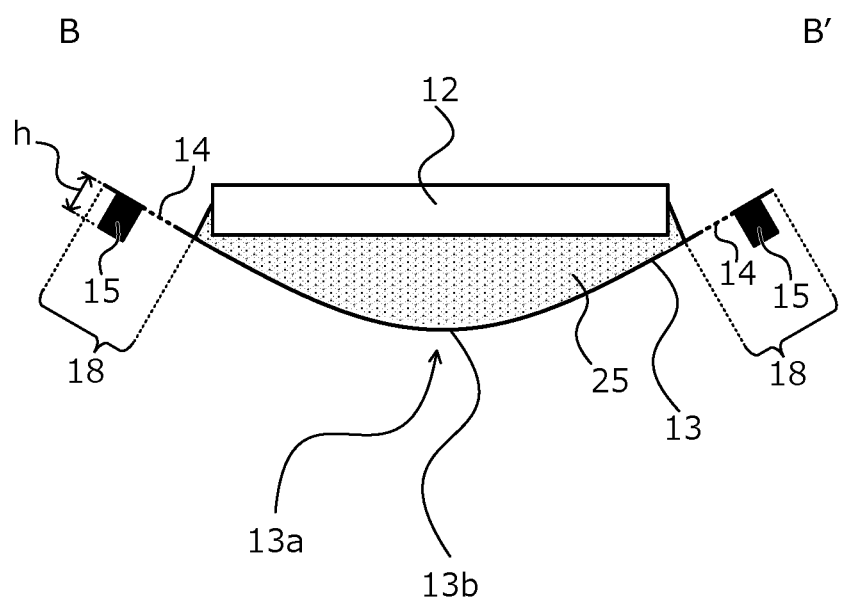
FIG. 6B is a section view of the structure of the semiconductor module according to the second embodiment.

A structure of the semiconductor module according to a second embodiment will be described. FIGS. 6A and 6B are section views of a structure of the semiconductor module according to the second embodiment. A structure of the package housing the semiconductor module according to the second embodiment is similar to the structure of the package housing the semiconductor module according to the first embodiment, as depicted in FIGS. 1 and 2. FIG. 6A is a section view along cutting line A-A' shown in FIG. 2. FIG. 6B is a section view along cutting line B-B' shown in FIG. 2.

The semiconductor module according to the second embodiment differs from the semiconductor module according to the first embodiment in that the base plate 13 is provided with a spacer 15 that suppresses deformation of the base plate 13 when the base plate 13 and the cooling fin 17 are screwed together.

In particular, as depicted in FIGS. 6A and 6B, the rear surface of the base plate 13 is provided with the spacer 15, at the part 18 of the base plate 13, the part 18 being closer than the edge of the solder layer 25 to the perimeter of the base plate 13. The solder layer 25 bonds the stacked substrate 12 and when two or more of the stacked substrates 12 are arranged on the base plate 13, said solder layer 25 edge is that which is closest to the edge of the base plate 13, among the edges of the solder layers 25. The part 18 of the base plate 13 closer than the edge of the solder layer 25 to the perimeter is a region from the edge of the base plate 13 to an edge of the solder layer 25, said solder layer 25 edge being closest to the edge of the base plate 13 among edges of the solder layer(s) 25. Alternatively, the spacer 15 may be provided near the through hole 14 of the base plate 13, whereby overtightening of the screw 16 may be prevented.

The spacer 15 has a function of suppressing deformation of the base plate by being sandwiched between the base plate 13 and the cooling fin 17 when the base plate 13 is fixed to the surface of the cooling fin 17 by tightening of the screw 16 inserted into the through hole 14 of the base plate 13 and the cooling fin 17, as depicted in FIG. 8. In other words, the spacer 15 has a function of maintaining a predetermined distance between the base plate 13 and the cooling fin 17 when the screw 16 is tightened to fix the base plate 13 to the cooling fin 17 and thereby prevents curvature of the rearward-convex part 13a of the base plate 13 from becoming too small. As a result, at the stacked substrate 12, tensile stress such as warping in an opposite direction from the rearward-convex part 13a of the base plate 13 (convex in upward direction) is suppressed, preventing the generation of cracks in the insulating substrate 21.

The spacer 15 may be formed using a same metal material as that of the base plate 13. The spacer may be formed using, for example, aluminum, nickel, or resin different from the base plate 13. A cross-sectional shape of the spacer 15 may be substantially rectangular, substantially semicircular where the spherical surface is in contact with the cooling fin 17, substantially trapezoidal or substantially a right triangular shape where the hypotenuse is in contact with the base plate 13. As depicted in FIG. 9B, when the spacer 15 is provided near the through hole 14 of the base plate 13, a planar shape of the spacer 15 may be an arc-shape surrounding a part of the through hole 14, which has a substantially circular shape, or as depicted in FIG. 10B, may be a circular shape surrounding a perimeter of the through hole 14.

As depicted in FIG. 8, a height h of the spacer 15 is at most a distance between the base plate 13 and the cooling fin 17, at the part 18 of the base plate 13, when the vertex 13b of the rearward-convex part 13a of the base plate 13 is in contact with the surface of the cooling fin 17, the part 18 being closer than the edge of the solder layer 25 to the perimeter of the base plate 13. In particular, the height h of the spacer 15 is, for example, about 10 µm to 100 µm and, for example, may be about 20 µm to 50 µm. The reason for this is as follows. When the height h of the spacer 15 is less than 10 µm, a function of providing the spacer 15 is not obtained. Furthermore, by setting the height h of the spacer 15 to be at least 20 µm, decreases in the curvature of the rearward-convex part 13a of the base plate 13 are more effectively suppressed. When the height h of the spacer 15 exceeds 100 µm, the vertex 13b of the rearward-convex part 13a of the base plate 13 is not in contact with the surface of the cooling fin 17 and therefore, heat dissipation is impeded. Further, by setting the height h of the spacer 15 to be at most 50 µm, an adhesion range of the rearward-convex part 13a of the base plate 13 and the cooling fin expands, improving heat dissipation.

Figure 7A:
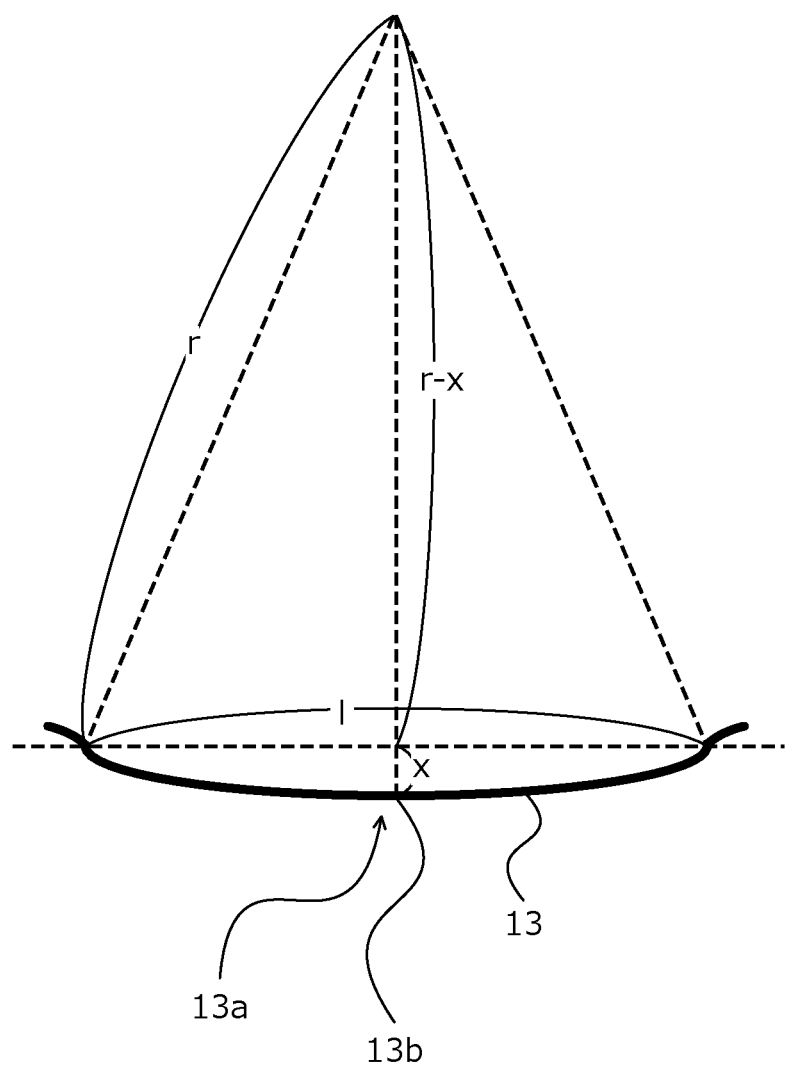
FIG. 7A is a diagram for explaining a method of calculating a height of a spacer of the base plate.

In particular, the height h of the spacer 15 is calculated at follows. FIGS. 7A and 7B are diagrams for explaining a method of calculating the height of the spacer of the base plate. FIG. 7A depicts the method of calculating the height h of the spacer 15 in a case where the stacked substrate 12 is arranged singularly without arrangement of the stacked substrate 12 in plural along one direction on the base plate 13, that is, a case where the base plate 13 has one rearward-convex part 13a in a cross-section. FIG. 7B depicts the method of calculating the height h of the spacer 15 in a case where n(n≥2) stacked substrates 12 are arranged in a row on the base plate 13, that is, a case where n rearward-convex parts 13a are arranged on the base plate 13.

In FIGS. 7A and 7B, the base plate 13 is indicated by a thick line and dimensions used in calculating the height h of the spacer 15 are shown. In particular, for the base plate 13, curvature (curvature of the spherical crown, i.e., curvature an arc that is the cross-sectional shape of the rearward-convex part 13a) of the rearward-convex part 13a is assumed to be 1/r, a diameter (diameter of the bottom of the spherical crown, i.e., chord length of the arc that is the cross-sectional shape of the rearward-convex part 13a) of the rearward-convex part 13a is assumed to be l, and a height (height of the spherical crown, i.e., height of the arc that is the cross-sectional shape of the rearward-convex part 13a) the rearward-convex part 13a is assumed to be x. The height x of the rearward-convex part 13a of the base plate 13 is a distance from the edge of the base plate 13 to the surface of the cooling fin 17, and corresponds to a maximum value of the height h of the spacer 15 (x≥h). When the height h of the spacer 15 exceeds the height x of the rearward-convex part 13a of the base plate 13, the vertex 13b of the rearward-convex part 13a of the base plate 13 is not in contact with the surface of the cooling fin 17 and thus, is not desirable.

As depicted in FIG. 7A, when the stacked substrate 12 is arranged singularly on the base plate 13, the base plate 13 has one rearward-convex part 13a. Here, a right triangular shape is considered where a radius r of the rearward-convex part 13a of the base plate 13 is assumed as a hypotenuse and ½ of the diameter l of the rearward-convex part 13a is assumed as a bottom. A height of this right triangle is a value obtained by subtracting the height x of the rearward-convex part 13a from the radius r of the rearward-convex part 13a (=r−x) and therefore, equation (2) is established according to the Pythagorean theorem. When equation (2) is rewritten to solve for the height x of the rearward-convex part 13a, equation (3) is obtained. In other words, when the stacked substrate 12 is arranged singularly on the base plate 13, the height h of the spacer 15 is at most the height x of the rearward-convex part 13a obtained by equation (3).

$$r^2 = (r-x)^2 + \left(\frac{l}{2}\right)^2 \quad (2)$$

$$x = r - \sqrt{r^2 - \left(\frac{l}{2}\right)^2} \quad (3)$$

Further, as depicted in FIG. 7B, when n stacked substrates 12 are arranged in a row on the base plate 13, the base plate 13 has a cross-sectional shape in which n rearward-convex parts 13a having substantially equal cross-sectional shapes are arranged in a row. In FIG. 7B, three rearward-convex parts 13a are depicted. Here, curvature of the frontward-convex part 13c of the base plate 13 and a part surrounded by a circle indicated by reference character 13e, that is, a diameter of a section (the bottom of the spherical crown) are not taken into consideration. This case is equivalent to arranging the n stacked substrates 12 on the base plate 13 so as to satisfy equation (3).

In other words, the diameter l of the rearward-convex part 13a is a value obtained by dividing an interval L of adjacent through holes 14 sandwiching the n stacked substrates 12 by the number of the stacked substrates 12 (l=L/n, n≥2). Therefore, by substituting equation (4) into equation (3), equation (5) is obtained. In other words, when n stacked substrates 12 are arranged on the base plate 13, the height h of the spacer 15 is at most the height x of the rearward-convex part 13a obtained from equation (5).

$$l = \frac{L}{n} \quad (4)$$

$$x = r - \sqrt{r^2 - \left(\frac{L}{2n}\right)^2} \quad (5)$$

Alternatively, the height h of the spacer 15 may satisfy equation (6). A reason for setting a lower limit of the height h of the spacer 15 as a left-side term of equation (6) is that when the lower limit of the height h of the spacer 15 is lower than a value of the left-side term of equation (6), the effect of providing the spacer 15 is not obtained.

$$0.1 \times \left(r - \sqrt{r^2 - \left(\frac{L}{2n}\right)^2}\right) \leq h \leq r - \sqrt{r^2 - \left(\frac{L}{2n}\right)^2} \quad (6)$$

For example, a curvature 1/r of the rearward-convex part 13a of the base plate 13 is assumed to be 0.1×10⁻³/mm. At the base plate 13, the interval L of the through holes 14 is assumed to be 100 mm and between the through holes 14, two stacked substrates 12 are assumed to be arranged (L=100 mm, n=2). In this case, from equation (5), the height x of the rearward-convex part 13a is 31 μm. Therefore, the height h of the spacer 15 of the base plate 13 is less than 31 μm and may be set to be 20 μm (≈31 μm×⅔) which is about ⅔ of the height x of the rearward-convex part 13a.

Further, for example, the curvature 1/r of the rearward-convex part 13a of the base plate 13 is assumed to be 0.4×10⁻³/mm. At the base plate 13, the interval L of the through holes 14 is assumed to be 150 mm and three stacked substrates 12 are assumed to be arranged between the through holes 14 (L=150 mm, n=3). In this case, from equation (5), the height x of the rearward-convex part 13a is 80 μm. Therefore, the height h of the spacer 15 of the base plate 13 is less than 125 μm and may be set to be 80 μm (≈125 μm×⅔) which is about ⅔ of the height x of the rearward-convex part 13a.

Here, although a case is assumed where the rearward-convex part 13a is a spherical crown shape, even in a case where the rearward-convex part 13a has a bottom that is a part of an ellipsoid that is oblong and not circular, the height h of the spacer 15 may be calculated by a same method as the described method of calculation. For example, the height (the height of the arc that is the cross-sectional shape of the rearward-convex part 13a as an ellipsoid) of the rearward-convex part 13a is set to be x, a minor axis or major axis of the ellipsoid bottom is set to be l, and an average curvature of the rearward-convex part 13a measured in a minor axis direction or a major axis direction of the ellipsoid is set to be 1/r.

An assembly process for fixing the semiconductor module according to the second embodiment to the surface of the cooling fin 17 will be described. FIG. 8 is a section view schematically depicting a fixing method for the cooling fin of the semiconductor module according to the second embodiment.

First, similarly to the first embodiment, as the first process, the rear surface of the semiconductor chip 11 is soldered to the conductive plate 22 of the front surface of the stacked substrate 12, as depicted in FIGS. 3 and 4.

Next, similarly to the first embodiment, as the second process, the conductive plate 23 of the rear surface of the stacked substrate 12 is soldered to the front surface of the base plate 13. Thus, as depicted in FIG. 8, similarly to the first embodiment, the rearward-convex parts 13a are formed at the base plate 13. As depicted in FIGS. 3 and 4, the spacers 15 are provided in advance at the part 18 of the base plate 13, before the stacked substrates 12 are soldered to the rear surface of the base plate 13, the part 18 being closer than the edge of the solder layer 25 to the perimeter of the base plate 13.

Next, as the third process, as depicted in FIG. 8, similarly to the first embodiment, after the base plate 13 is placed on the surface of the cooling fin 17 with the rear surface of the base plate 13 facing toward the cooling fin 17, the screws 16 are inserted in the through holes 14 of the base plate 13 and then in the screw holes 20 of the cooling fin 17 and are tightened, fixing the base plate 13 to the surface of the cooling fin 17. At this time, the screws 16 are inserted in the screw holes 20 of the cooling fin 17 until the spacers 15 of the rear surface of the base plate 13 are in contact with the cooling fin 17, and the spacers 15 are sandwiched between the base plate 13 and the cooling fin 17.

By these processes, the vertex 13b of the rearward-convex part 13a of the base plate 13 is placed in contact with the surface of the cooling fin 17. Additionally, at the part 18 of the base plate 13, the part 18 being closer than the edge of the solder layer 25 to the perimeter of the base plate, a predetermined distance between the base plate 13 and the cooling fin 17 is ensured by the spacer 15. Therefore, the edge of the base plate 13 is suppressed from being pulled toward the cooling fin 17, for example, in a direction indicated by an arrow 19a, and tensile stress in the insulating substrate 21, in a direction 19b parallel to a main surface of the insulating substrate 21 is suppressed. Thus, the assembly process is completed.

The cooling fin 17 is made using a material that is a good thermal conductor such as aluminum (Al) or copper (Cu), and alloys containing these as main components. Although not depicted, the cooling fin 17 has a base part and a heat dissipation fin part. The base part has a plate-like shape, where at a first surface, the base plate 13 is attached and fixed, and at a second surface the heat dissipation fin part is provided. The base part conducts heat that is generated by the semiconductor chip 11 on the base plate 13 to the heat dissipation fin part, via the stacked substrate 12. The heat dissipation fin part has plural heat dissipation fins protruding in a comb-like shape from the second surface of the base part, and has a function of dissipating from the heat dissipation fins, the heat conducted from the base part. Further, the cooling fin 17 may be a cooling fin in which a flow path through which a refrigerant flows is formed inside a plate-like structure.

A method of forming the spacer 15 of the base plate 13 will be described. FIGS. 9A, 10A, 11, and 12 are cross-sectional views depicting an example of a method of forming the spacer of the base plate in FIG. 8. FIG. 9B is a plan view depicting a layout of the spacer in FIG. 9A as viewed from the rear surface side of the base plate. FIG. 10B is a plan view depicting a layout of the spacer in FIG. 10A as viewed from the rear surface side of the base plate. FIGS. 9B and 10B depict a state near one of the through holes 14 of the base plate 13, as viewed from the rear surface side of the base plate 13. In FIGS. 9B and 10B, a part from the left side to the bottom is an outer periphery of the base plate 13, while the upper and right sides are on the central part side of the base plate 13.

Figure 9A:
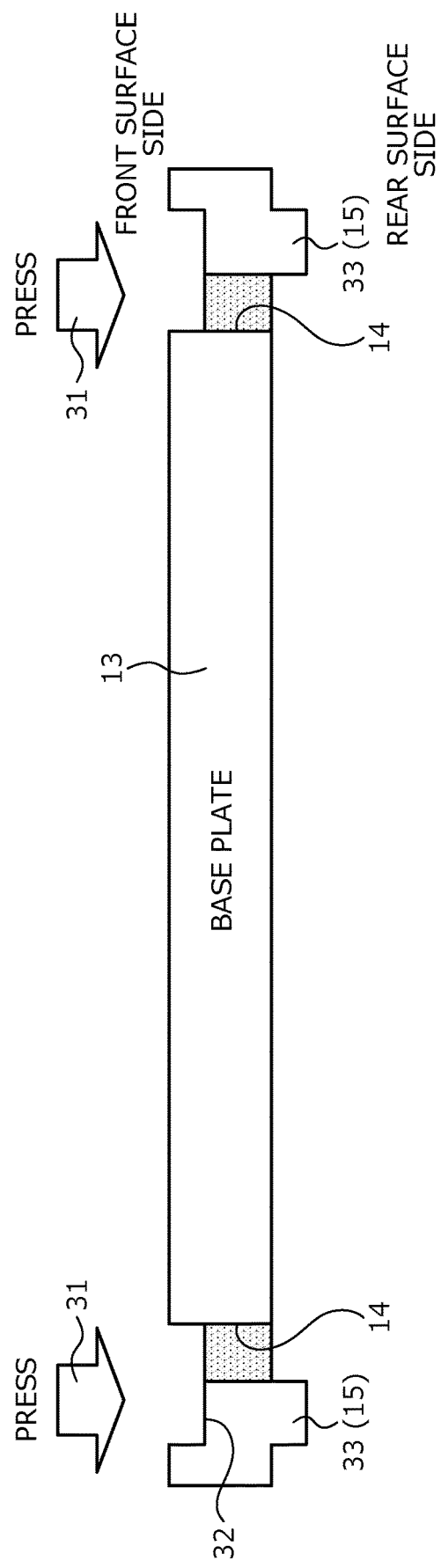
FIG. 9A is a cross-sectional view depicting an example of a method of forming the spacer of the base plate in FIG. 8.
Figure 9B:
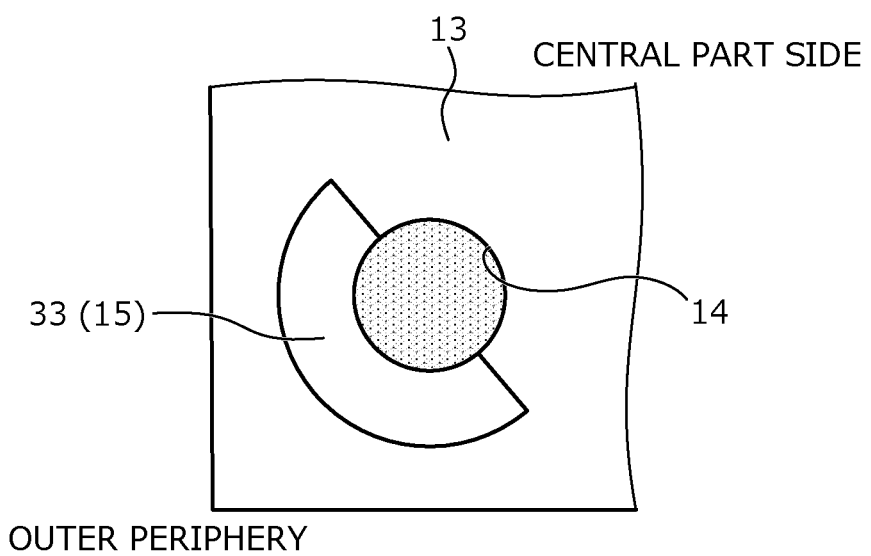
FIG. 9B is a plan view depicting a layout of the spacer in FIG. 9A as viewed from a rear surface side of the base plate.
Figure 10A:
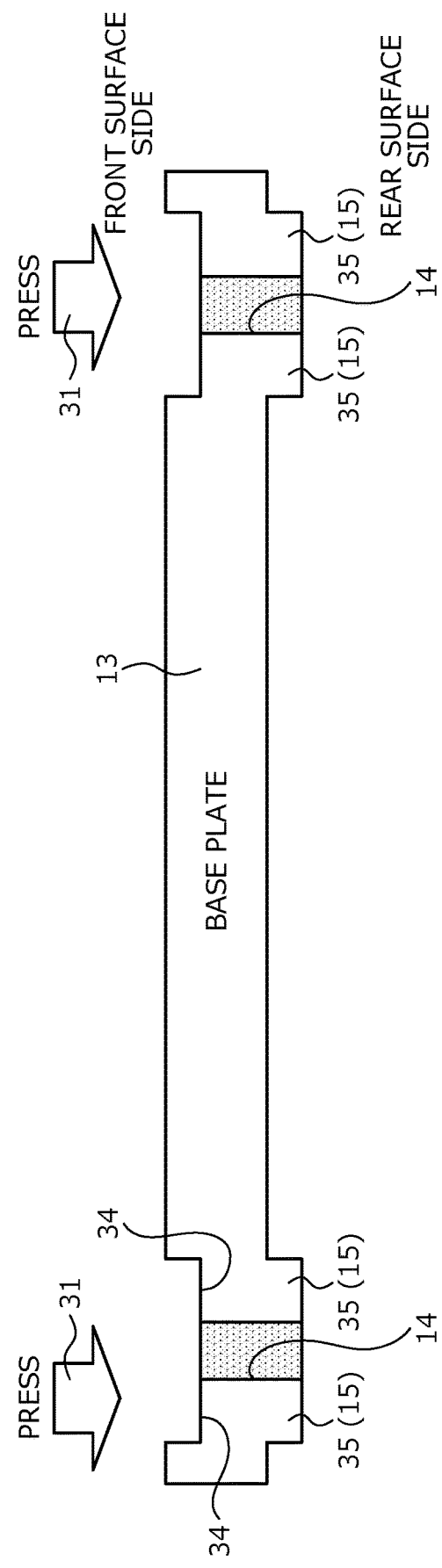
FIG. 10A is a cross-sectional view depicting an example of a method of forming the spacer of the base plate in FIG. 8.

As depicted in FIGS. 9A and 10A, a portion of the part 18 of the base plate 13, the part 18 being closer than the edge of the solder layer 25 to the perimeter of the base plate 13, may be subject to pressure (pressed) 31 from the front surface of the base plate 13 and pushed outward at the rear surface of the base plate 13, whereby a protrusion 33, 35 constituting the spacer 15 may be formed at the rear surface of the base plate 13. In other words, the spacers 15 are integrally created (formed) with the base plate 13 by a pressing process. At the part 18 of the base plate 13, the part 18 being closer than the edge of the solder layer 25 to the perimeter of the base plate 13, the protrusions 33, 35 is formed at the rear surface of the base plate 13 while the location and range of application of the pressure 31 to the base plate 13 may be variously changed.

For example, as depicted in FIG. 9B, the protrusion 33 having a planar shape that is an arc surrounding a part of the through hole 14 may be formed. FIG. 9B depicts a state in which the protrusion 33 having a planar shape that is a semicircular arc surrounding half the perimeter of the through hole 14 of the base plate 13 is arranged closer than the through hole 14 to the perimeter of the base plate 13. Further, for example, as depicted in FIG. 10B, the protrusion 35 having a circular planar shape surrounding the perimeter of the through hole 14 entirely may be formed. Reference numerals 32, 34 are grooves selectively formed in the front surface of the base plate 13 by applying the pressure 31 to a portion of the base plate 13.

Further, as depicted in FIG. 11, in the part 18 of the base plate 13, a metal member 36 constituting the spacer 15 may be bonded to the rear surface of the base plate 13 by, for example, ultrasonic bonding, laser welding, etc., the part 18 being closer than the edge of the solder layer 25 to the perimeter of the base plate 13. Further, the metal member 36 constituting the spacer 15, for example, may be formed by plating, or may be formed using a resin such as an adhesive or the like. In FIG. 11, although the metal member 36 having a circular planar shape surrounding a part of the through hole 14 of the base plate 13 is depicted, in the part 18 of the base plate 13, the metal member 36 may be bonded to the rear surface of the base plate 13, the part 18 being closer than the edge of the solder layer 25 to the perimeter of the base plate 13. For example, a metal member having a circular planar shape surrounding the perimeter of the through hole 14 of the base plate 13 may be bonded.

Further, the semiconductor module according to the second embodiment depicted in FIG. 12 has a configuration in which a fixing component (hereinafter, fixing ring) 37 having a ring shape (cylinder shape) is press fit into a through hole 5a of the resin case 5 and the through hole 14 of the base plate 13, whereby the resin case 5 is fixed the base plate 13. A part 37a of the fixing ring 37 protruding from the rear surface of the base plate 13 may be used as the spacer 15. In this case, the screw 16 is inserted in an interior (cavity) 38 of the fixing ring 37, fixing the base plate 13 to the cooling fin 17.

As described, according to the second embodiment, effects similar to those of the first embodiment may be obtained. Further, according to the second embodiment, the base plate has the rearward-convex part where the stacked substrate is soldered to the base plate, and at a part of the base plate closer than the solder layer edge to the perimeter of the base plate, the spacers are provided at the rear surface of the base plate. As a result, when the base plate is screwed to the cooling fin with the rear surface facing the cooling fin, the rearward-convex part of the base plate is in contact with the cooling fin and at parts of the base plate other than the rearward-convex parts, the spacer is sandwiched between the base plate and the cooling fin. In this manner, the base plate is in contact with the cooling fin at the rearward-convex part, whereby heat from the semiconductor chip may be dissipated to the cooling fin, enabling heat dissipation of the semiconductor chip to be ensured. Further, at parts of the base plate other than the rearward-convex part, the spacer is sandwiched between the base plate and the cooling fin, whereby even when the base plate is screwed (overtightened) near the through hole to be in contact with the cooling fin, the end of the base plate is not excessively pressed toward the cooling fin. A decrease in the curvature of the rearward-convex part, that is, deformation of the base plate, is suppressed and therefore, the tensile stress generated at the insulating substrate is minimal. Accordingly, cracking of the insulating substrate may be prevented while heat dissipation of the semiconductor chip is ensured.

Figure 13B:
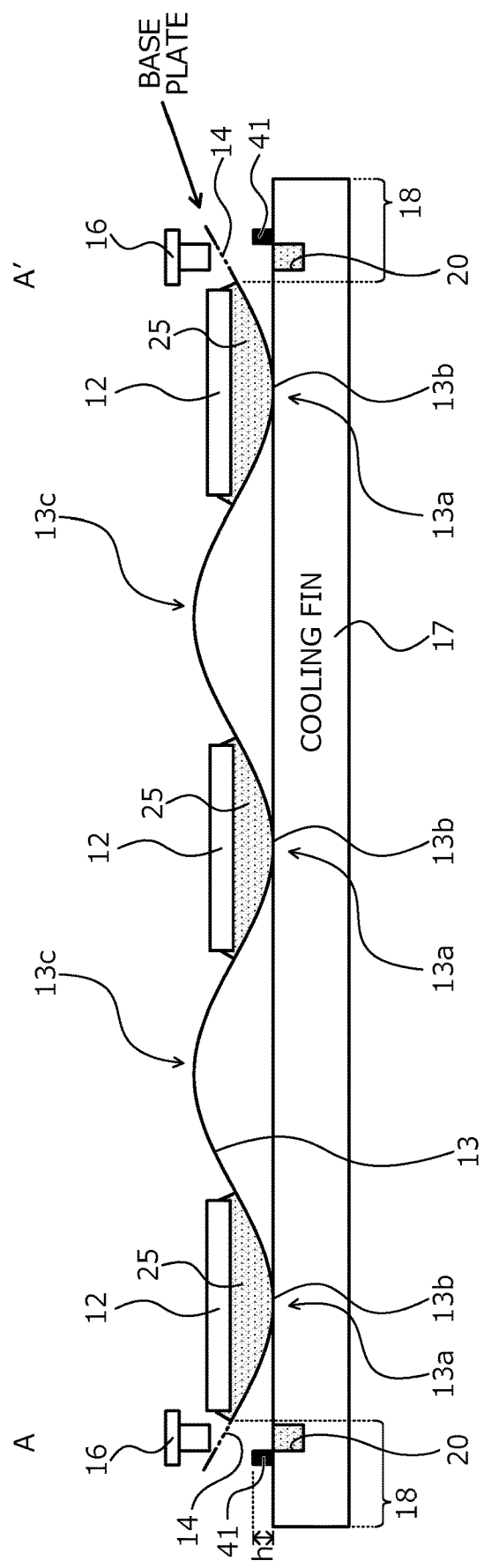
FIG. 13B is a cross-sectional view schematically depicting the fixing method for the cooling fin of the semiconductor module according to the third embodiment.

A method of forming the spacer used when the semiconductor module according to a third embodiment is housed in a package will be described. FIG. 13A is a cross-sectional view depicting an example of a method of manufacturing the spacer used when the semiconductor module according to the third embodiment is housed in a package. FIG. 13B is a cross-sectional view schematically depicting the fixing method for the cooling fin of the semiconductor module according to the third embodiment. The semiconductor module according to the third embodiment differs from the semiconductor module according to the second embodiment in that the semiconductor module according to the third embodiment has a configuration in which deformation of the base plate 13 occurring when the base plate 13 and the cooling fin 17 are screwed is suppressed by using a spacer 41 at the package without using a spacer at the semiconductor module itself.

In particular, in the third embodiment, as depicted in FIG. 13A, the spacer 41 is provided at the surface of the cooling fin 17 so as to surround at least a part of the perimeter of the screw hole 20 of the cooling fin 17. At the time of screw tightening to fix the base plate 13 to the cooling fin 17, the spacer 41 is sandwiched between the base plate 13 and the cooling fin 17, at the part 18 of the base plate 13, the part 18 being closer than the edge of the solder layer 25 to the perimeter of the base plate 13. Accordingly, as depicted in FIG. 13B, a structure of the semiconductor module according to the third embodiment is similar to that of the semiconductor module according to the first embodiment depicted in FIGS. 3, 4, 5A, and 5B. The structure of the package housing the semiconductor module according to the third embodiment is similar to that of the package housing the semiconductor module according to the first embodiment depicted in FIGS. 1 and 2.

As a method of forming the spacer 41 at the surface of the cooling fin 17, similarly as in the second embodiment, a protrusion created (formed) at the surface of the cooling fin 17 by a pressing process may be used as the spacer 41, or a metal member 42 bonded to the surface of the cooling fin 17 may be used as the spacer 41. Further, the spacer 41, for example, may be formed by plating, or may be formed using a resin such as an adhesive, which is not depicted. FIGS. 13A and 13B depict a case in which the metal member 42 bonded to the surface of the cooling fin 17 is used as the spacer 41. The spacer 41 protrudes from the surface of the cooling fin 17 toward the base plate 13 and has a predetermined height. The height h is the same as that in the second embodiment. A method of calculating the height h of the spacer 41 is similar to that of the second embodiment.

An assembly process for fixing the semiconductor module according to the third embodiment to the surface of the cooling fin 17 will be described with reference to FIGS. 3, 4, and 13B. First, similarly to the first embodiment, as the first process, the rear surface of the semiconductor chip 11 is soldered to the conductive plate 22 of the front surface of the stacked substrate 12 as depicted in FIGS. 3 and 4. Next, similarly to the first embodiment, as the second process, the conductive plate 23 of the rear surface of the stacked substrate 12 is soldered to the front surface of the base plate 13. As a result, as depicted in FIG. 13B, similarly to the first embodiment, the rearward-convex part 13a is formed on the base plate 13.

Next, as the third process, as depicted in FIG. 13B, similarly to the first embodiment, after the base plate 13 is placed on the surface of the cooling fin 17 with the rear surface of the base plate 13 facing toward the cooling fin 17, the screws 16 are inserted in the through holes 14 of the base plate 13 and then in the screw holes 20 of the cooling fin 17 and are tightened, fixing the base plate 13 to the surface of the cooling fin 17. The spacers 41 are provided in advance at the surface of the cooling fin 17 before the base plate 13 is fixed by tightening screws. Thus, the screws 16 are inserted in the screw holes 20 of the cooling fin 17 until the spacers 41 at the surface of the cooling fin 17 are in contact with the base plate 13, and the spacers 41 are sandwiched between the base plate 13 and the cooling fin 17, thereby, obtaining similar effects of the second embodiment. Thus, the assembly process is completed.

As described, according to the third embodiment, effects similar to those of the first embodiment may be obtained. Further, according to the third embodiment, even when the spacers are provided at the package, effects similar to those of the second embodiment may be obtained.

In the present invention, without limitation to the embodiments, various modifications are possible within a range not deviating from the spirit of the invention. For example, at the rear surface of the base plate, or at the base-plate contact surface of the cooling fin, a heat dissipating grease may be applied, whereby the heat dissipating grease may be present in a gap between the base plate and the cooling fin. Further, plural rows of n stacked substrates may be provided. In the described embodiments, although a case has been described where an IGBT chip and a diode chip are mounted on the front surfaces of stacked substrates as semiconductor chips, without limitation hereto, various types of semiconductor chips may be mounted on the front surfaces of the stacked substrates. For example, in place of an IGBT chip, a semiconductor chip of a metal oxide semiconductor field effect transistor (MOSFET) may be mounted.

According to the embodiments, the part of the base plate where the stacked substrate is arranged is at the vertex of the curved part (curved portion) and is in contact with the cooling fin. Therefore, heat dissipation from the semiconductor chips on the stacked substrates to the cooling fin may be performed smoothly, enabling cracking of insulating substrate constituting the stacked substrate to be prevented.

According to the embodiments, when the base plate is screwed to the cooling fin, a curved part of the base plate is in contact with the cooling fin and at parts of the base plate other than the curved part, the spacer is sandwiched between the base plate and the cooling fin. The curved part of the base plate is in contact with the cooling fin, enabling heat dissipation to be maintained, and the spacer being sandwiched between the base plate and the cooling fin reduces the tensile stress on the stacked substrate.

The semiconductor module, the base plate of the semiconductor module, and the method of manufacturing a semiconductor device of the present invention achieve an effect in that heat dissipation is maintained while cracking of the insulating substrate (stacked substrate) may be prevented.

As described, the semiconductor module, the base plate of the semiconductor module, and the method of manufacturing a semiconductor device of the present invention are useful for a semiconductor module equipped with a base plate fixed to a cooling fin and are particularly suitable for semiconductor modules on which a semiconductor chip for a vertical semiconductor element such as an IGBT is mounted.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor module, comprising:
    a plurality of stacked substrates each having a semiconductor chip mounted thereon;
    a cooling fin;
    a base plate having a front surface and a rear surface, and
       a plurality of concave curved portions each include, at a front surface side, a bonding area to which a corresponding one of the stacked substrates is bonded, the base plate contacting, at a rear surface side, the cooling fin at a vertex of each of the concaved curved portions so that the base plate contacts the cooling fin under each bonding area to which the corresponding one of the stacked substrates is bonded, the base plate having a plurality of through holes, each of which is located outside of the bonding area;

a plurality of screws, each of which is inserted to a corresponding one of the plurality of through holes of the base plate so that the base plate is fixed to the cooling fin; and a plurality of spacers, each of which is disposed at a position adjacent to a corresponding one of the through holes.

2. The semiconductor module according to claim 1, wherein the concave curved portion of the base plate is disposed at the bonding area of the stacked substrate.

3. The semiconductor module according to claim 1, wherein the bonding area includes a plurality of bonding areas, the stacked substrate includes two or more stacked substrates that are respectively bonded to the base plate at respective ones of the plurality of bonding areas, and the concave curved portion of the base plate includes a plurality of concave curved portions, each of which is disposed at a respective one of the bonding areas.

4. The semiconductor module according to claim 1, wherein the concave curved portion has a curvature in a range of $0.1 \times 10^{-3}$/mm to $0.4 \times 10^{-3}$/mm.

5. The semiconductor module according to claim 1, wherein the base plate has a rectangular planar shape having corners, and each of the plurality of through holes is arranged at a respective corner of the base plate.

6. The semiconductor module according to claim 1, wherein each spacer disposed closer to the perimeter of the base plate than is the bonding area of the stacked substrate, and being sandwiched between the base plate and the cooling fin.

7. The semiconductor module according to claim 1, wherein each spacer is arranged in a vicinity of one of the plurality of through holes.

8. The semiconductor module according to claim 1, wherein each spacer has an arc-shaped planar shape that partially surrounds one of the plurality of through holes.

9. The semiconductor module according to claim 6, wherein each spacer has a circular planar shape that surrounds one of the plurality of through holes.

10. The semiconductor module according to claim 1, wherein each spacer is integrally formed with the base plate and protrudes by a predetermined height from the rear surface of the base plate.

11. The semiconductor module according to claim 6, further comprising the cooling fin, wherein each spacer is integrally formed with the cooling fin and protrudes by a predetermined height from a front surface of the cooling fin, facing the rear surface of the base plate.

12. The semiconductor module according to claim 6, wherein each spacer is bonded to the base plate and protrudes by a predetermined height from the rear surface of the base plate.

13. The semiconductor module according to claim 6, further comprising:

a fixing component having a cylinder shape and press fitted from the front surface of the base plate into one of the plurality of through holes, the screws being insertable into the fixing component, the fixing component having a portion protruding from the rear surface of the base plate that serves as each spacer.

14. The semiconductor module according to claim 1, the stacked substrate includes a plurality of stacked substrates that are respectively bonded to the base plate, each spacer has a height h that satisfies:

$$0.1 \times \left( r - \sqrt{r^2 - \left(\frac{L}{2n}\right)^2} \right) \le h \le r - \sqrt{r^2 - \left(\frac{L}{2n}\right)^2}$$

where, 1/r is a curvature of the concave curved portion, L is a distance between adjacent two of the plurality of through holes, and n is a number of the stacked substrates in a row.

15. The semiconductor module according to claim 1, wherein each spacer has a height in a range of 10 μm to 100 μm.

16. The semiconductor module according to claim 15, wherein said each spacer has a height in the range of 20 μm to 50 μm.

* * * * *